(12) United States Patent
Ghinovker

(10) Patent No.: US 8,513,822 B1
(45) Date of Patent: Aug. 20, 2013

(54) THIN OVERLAY MARK FOR IMAGING BASED METROLOGY

(75) Inventor: Mark Ghinovker, Yoqneam Ilit (IL)

(73) Assignee: KLA-Tencor Corporation, Milpitas, CA (US)

( * ) Notice: Subject to any disclaimer, the term of this patent is extended or adjusted under 35 U.S.C. 154(b) by 411 days.

(21) Appl. No.: 12/827,499

(22) Filed: Jun. 30, 2010

(51) Int. Cl.
*H01L 27/108* (2006.01)

(52) U.S. Cl.
USPC .......... 257/797; 257/48; 438/14; 438/16; 438/461; 438/462

(58) Field of Classification Search
USPC ........... 257/48, 797, E23.179; 438/14, 16, 438/401, 461–462; 356/366; 382/114–145, 382/287, 289
See application file for complete search history.

(56) References Cited

U.S. PATENT DOCUMENTS

| 6,077,756 A * | 6/2000 | Lin et al. ............... 438/401 |
| 7,541,201 B2 * | 6/2009 | Ghinovker ............... 438/16 |
| 2007/0222088 A1 * | 9/2007 | Smith et al. ............... 257/797 |

* cited by examiner

*Primary Examiner* — Dung A. Le
(74) *Attorney, Agent, or Firm* — Suiter Swantz pc llo

(57) ABSTRACT

A thin overlay structure for use in imaging based metrology is disclosed. The thin overlay structure may include a first structure and second structure, the first and second structures designed to have a common center of symmetry, both structures being invariant to a 180 degree rotation about the common center of symmetry, wherein a mark region defining the extent of the structures is characterized by a first direction and a second direction orthogonal to the first direction, a length of the mark region along the first direction being greater than a length of the mark region along the second direction.

25 Claims, 9 Drawing Sheets

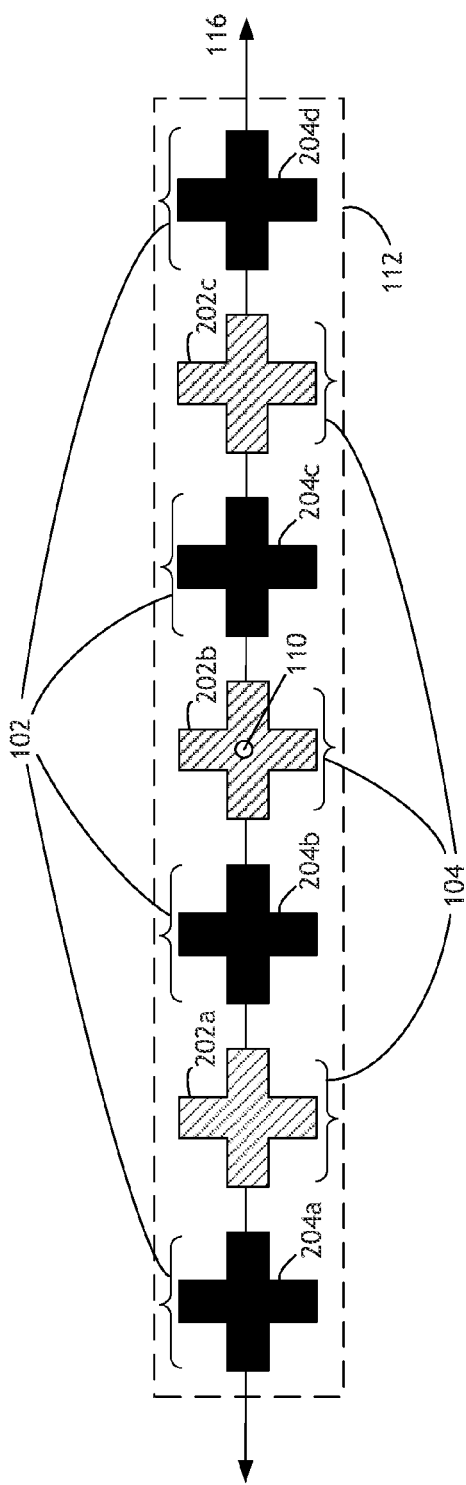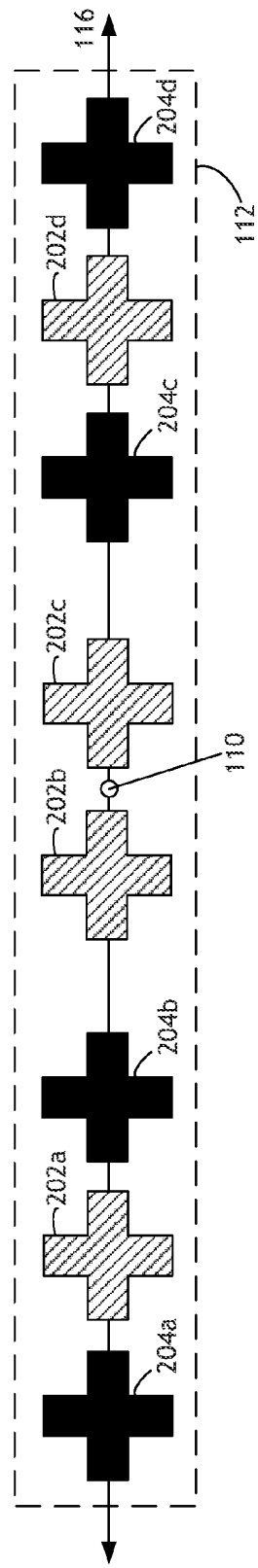

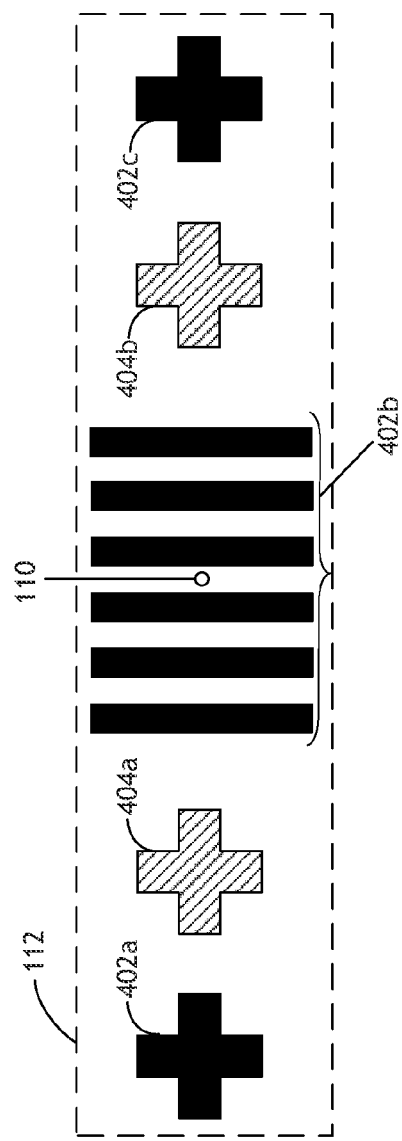
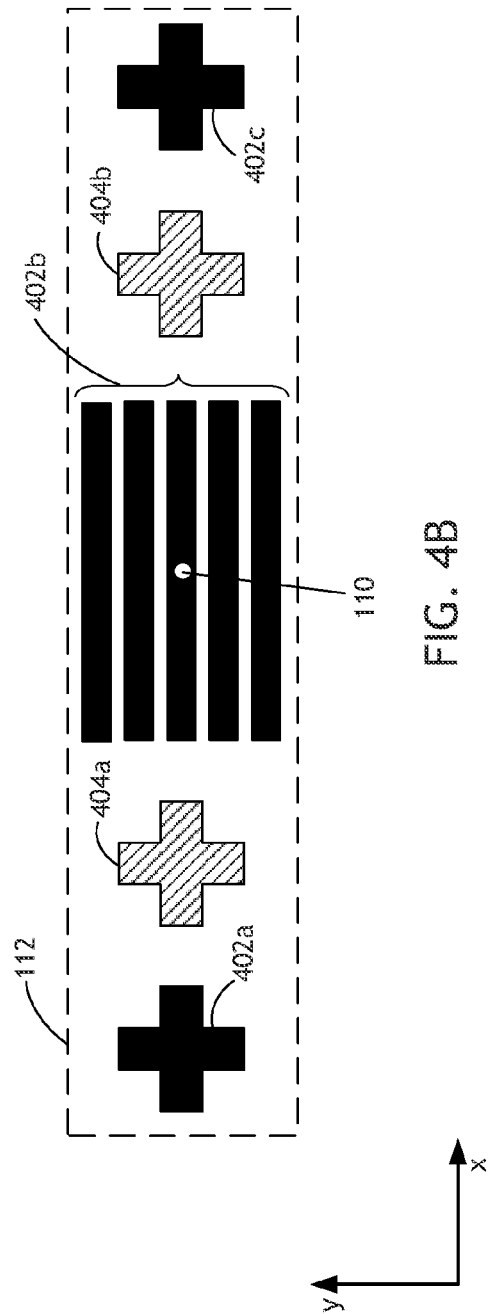

THIN OVERLAY MARK FOR IMAGING BASED METROLOGY

TECHNICAL FIELD

The present invention generally relates to an overlay mark used for overlay metrology, and more particularly to a thin overlay mark allowing for more efficient use of semiconductor layer surface area.

BACKGROUND

Overlay error measurement between successive semiconductor process layers is critical in the manufacture of integrated circuit devices. While traditional overlay techniques have proven useful, as semiconductor surface area becomes even more precious, the need for improved utilization of semiconductor surface area increases. For example, a thin overlay mark suitable for imaging based metrology would be a useful solution to increased demand for more efficient semiconductor surface area utilization.

SUMMARY

A multidirectional overlay mark for use in imaging based metrology is disclosed. In one aspect, the multidirectional overlay mark may include, but is not limited to, a first structure having a first pattern element, and a second structure having a second pattern element, wherein the first structure and the second structure have a common center of symmetry, wherein the first structure and the second structure are invariant to a 180 degree rotation about the common center of symmetry, wherein the first structure and the second structure are arranged within a mark region, and wherein the mark region is characterized by a first direction and a second direction, the second direction orthogonal to the first direction, a length of the mark region along the first direction being substantially greater than a length of the mark region along the second direction.

In another aspect, the multidirectional overlay mark may include, but is not limited to, a first structure having a first plurality of pattern elements, and a second structure having a second plurality of pattern elements, wherein the first structure and the second structure have a common center of symmetry, wherein the first structure and the second structure are invariant to a 180 degree rotation about the common center of symmetry, wherein the first structure and the second structure are arranged within a mark region, and wherein the mark region is characterized by a first direction and a second direction, the second direction orthogonal to the first direction, a length of the mark region along the first direction being substantially greater than a length of the mark region along the second direction.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 2A is a top plan view of an overlay an overlay mark, in accordance with one embodiment of the present invention.
FIG. 2B is a top plan view of an overlay an overlay mark, in accordance with one embodiment of the present invention.
FIG. 4A is a top plan view of an overlay an overlay mark, in accordance with one embodiment of the present invention.
FIG. 4B is a top plan view of an overlay an overlay mark, in accordance with one embodiment of the present invention.

DETAILED DESCRIPTION OF THE INVENTION

Reference will now be made in detail to the subject matter disclosed, which is illustrated in the accompanying drawings.

Referring generally to FIGS. 1A through 4D, a thin overlay mark 100 suitable for imaging based overlay metrology is described in accordance with the present disclosure. The thin overlay mark 100 suitable for imaging based metrology may include a first structure 102 and a second structure 104. The thin overlay mark 100 suitable for imaging based metrology may be used to determine overlay error between two successive process layers of a semiconductor wafer. For example, the thin overlay mark 100 may be utilized to measure the alignment of a first semiconductor layer with respect to a second semiconductor layer, where the second layer and the first layer are disposed successively. Additionally, the thin overlay mark 100 may be used to determine alignment error between two structures formed on a common semiconductor layer via two or more different processes. For example, the thin overlay mark 100 may be utilized to measure the alignment of a first pattern with respect to a second pattern, where the first pattern and the second pattern are successive patterns formed on the same semiconductor layer.

For example, in a measurement utilizing one or more thin overlay marks 100, the thin overlay marks 100 may be printed at a specific location on a first wafer layer and a second wafer layer so that when the first and second layers are properly aligned the pattern elements of the first structure and second structure of the thin overlay mark also align. When the first and second layers are mis-registered, however, this results in a relative shift between the pattern elements of the first structure 102 and the second structure 104 of a given thin overlay mark 100, a shift that can be measured using a variety of imaging based overlay metrology techniques. Measurement techniques that may be used in the context of the thin overlay mark 100 described herein are described in U.S. application Ser. No. 11/830,782 filed on Jul. 30, 2007, and Ser. No. 11/179,819 filed on Jul. 11, 2005, and are incorporated herein by reference.

The structures and pattern elements described herein are generally patterned using photolithographic, etching, and deposition techniques suitable for semiconductor wafer processing. Methods for printing overlay marks and their contained structures, pattern elements, and pattern sub-elements are described in U.S. application Ser. No. 11/179,819 filed on Jul. 11, 2005, which is incorporated above.

Figure 1A:
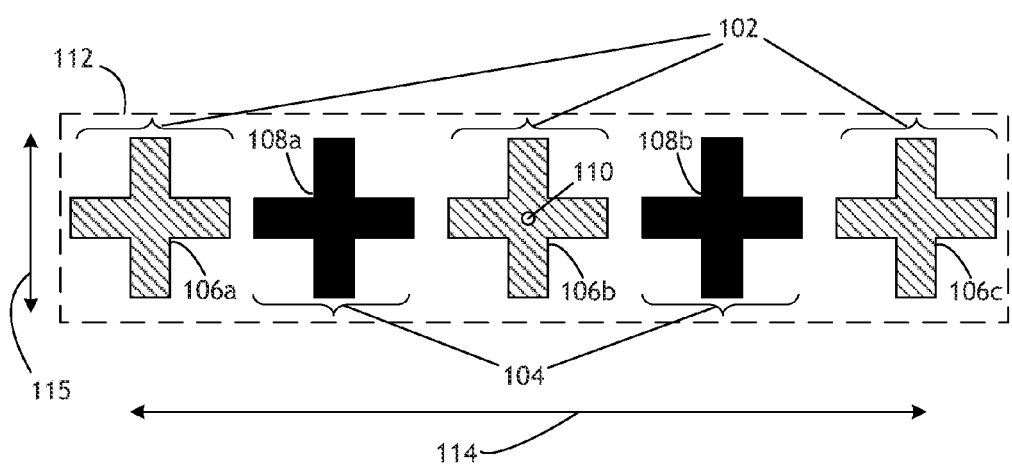
FIG. 1A is a top plan view of an overlay an overlay mark, in accordance with one embodiment of the present invention.
Figure 1B:
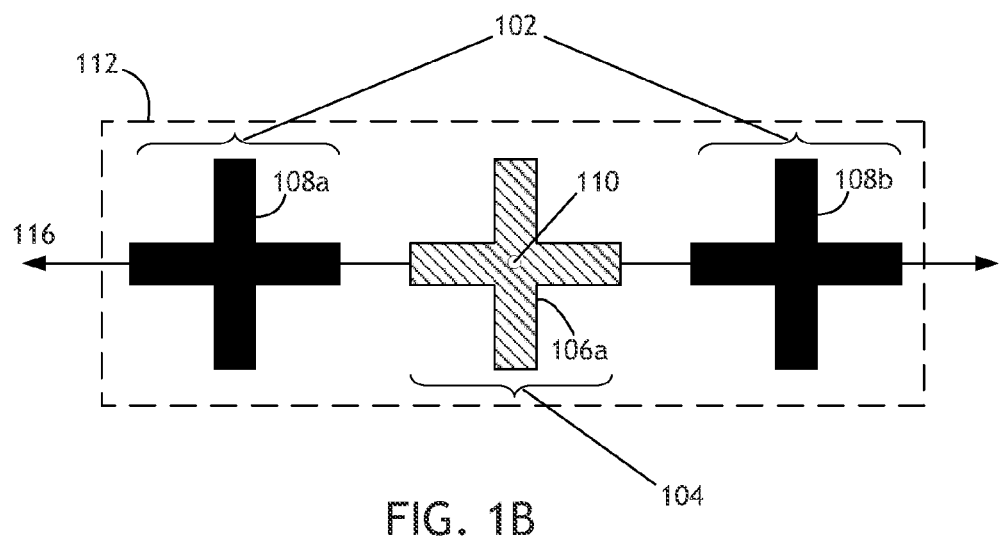
FIG. 1B is a top plan view of an overlay an overlay mark, in accordance with one embodiment of the present invention.
Figure 1C:
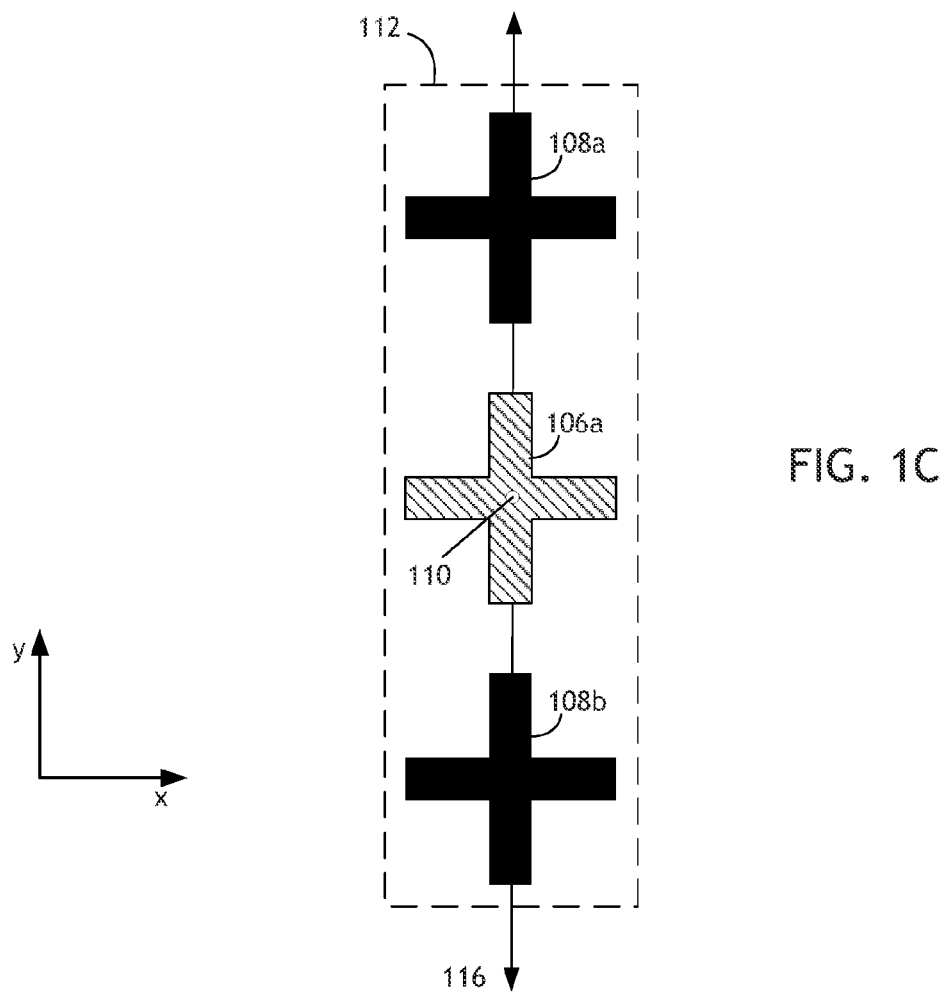
FIG. 1C is a top plan view of an overlay an overlay mark, in accordance with one embodiment of the present invention.

FIGS. 1A through 1C illustrate a top view of a thin overlay mark 100 suitable for imaging based metrology, in accordance with an exemplary embodiment of the present invention. The thin overlay mark 100 may include a first structure 102 having one or more pattern elements (e.g., 106a, 106b, and 106c) and a second structure 104 having one or more pattern elements (e.g., 108a, 108b, and 108c). For example, as shown in FIG. 1A, the first structure 102 may contain three distinct pattern elements, a first element 106a, a second element 106b, and third element 106c, while the second structure 104 may contain two distinct pattern elements, a first element 108a and a second element 108b. By way of further example, as shown in FIG. 1B, a first structure may contain a single pattern element (e.g., a first pattern element 106a), while the second structure may contain two pattern elements, such as a first pattern element 108a and a second pattern element 108b. More generally, a given structure (i.e., the first structure 102 or the second structure 104) may contain from one pattern element up to and including an Nth pattern element. Note that for the purposes of this disclosure solid shaded structure elements and texture shaded structure elements are used to represent pattern elements printed in different processes. For example, in FIG. 1A, the solid shaded cross shaped pattern elements, 106a through 106c, represent the pattern elements of the first structure printed on a semiconductor surface in a first process, while the texture shaded cross shaped pattern elements, 108a and 108b, represent the pattern elements of a second structure printed on a semiconductor surface in a second process.

Moreover, both the first structure 102 and the second structure 104 are designed such that each is invariant to a 180 degree rotation about a common center of symmetry 110. For example, as shown in FIG. 1A, upon rotating the first structure about the common center of symmetry 110 by 180 degrees the top view image of the first structure 102 remains substantially similar to the top view image of the first structure 102 prior to rotation. Similarly, upon rotating the second structure 104 about the common center of symmetry 110 by 180 degrees the top view image of the second structure 104 remains substantially similar to the top view image of the second structure 104 prior to rotation. Resultantly, it will be recognized by those skilled in the art that the overall mark, consisting of the first structure 102 and second structure 104, is invariant to a 180 degree rotation about the common center of symmetry 110 when the first structure 102 and the second structure 104 are properly aligned. It should be recognized that while the first structure 102 and the second structure 104 share a common center of symmetry by design when the first layer and second layer are properly aligned, upon misalignment between the first layer and second layer, the first structure 102 and the second structure 104 will appear shifted with respect to one another. As a result, the center of symmetry of the first structure 102 and the center of symmetry of the second structure 104 will shift with respect to one another and the center of symmetries of the first structure 102 and the second structure 104 will no longer coincide. It is the measurement of this shift between center of symmetries of the first structure 102 and the second structure 104 which represents the overlay measurement. Measurement techniques that may be used in the context of the thin overlay mark 100 described herein are described in U.S. application Ser. No. 11/830,782 filed on Jul. 30, 2007, and Ser. No. 11/179,819 filed on Jul. 11, 2005, and are incorporated herein by reference.

In addition, the first structure 102 and the second structure 104 are arranged so as to reside within a thin two dimensional mark region 112. More specifically, the first structure 102 and the second structure 104 are arranged so as to reside within a two dimensional mark region 112, wherein the mark region is characterized by a first direction 114 and a second direction 115 orthogonal to the first direction, wherein the length of the mark region along the first direction 114 is greater than a length of the mark region along the second direction 115. For example, as shown in FIG. 1A, the first structure 102 and second structure 104 are arranged within a rectangular mark region 112. Further, the rectangular mark region 112 has one side aligned with a first direction 114 (e.g., x-axis) and another side aligned with a second direction 115 (e.g., y-axis), the first direction 114 perpendicular to the second direction 115. The spatial extent of the mark region 112 being longer along the first direction 114 than the second direction 115. For instance, a 'thin' overlay mark 100 may have a narrow dimension as thin as 1 µm, and a long dimension of 40 µm. Generally, the upper limit of the mark region 112 size corresponds to the field of view (FOV) of the metrology tool used to perform the overlay measurement. These dimensions are not limitations but rather illustrations of possible thin overlay mark 100 dimensions. The narrowed dimensions of the 'thin' overlay mark described herein provides for increased flexibility in semiconductor wafer processing techniques. By decreasing the dimension of the overlay mark in a first dimension the semiconductor real estate can be more efficiently utilized. At the same time, the overlay mark may be increased along the second direction, orthogonal to the first direction, providing increased target sized and thus increased information content. Generally speaking, the thin overlay mark 100 may be designed such that the areal extent of the mark region 112 corresponds to the FOV. This, however, is not a limitation and it is contemplated herein that the FOV may be substantially larger than the mark region 112.

It will be recognized by one skilled in the art that the use of a rectangular mark region is not a limitation and that generally a variety of mark region shapes (e.g., thin trapezoid, thin parallelogram, or ellipse) may be used to characterize the perimeter of the thin overlay mark boundary. For example, the first structure 102 and second structure 104 of the thin overlay mark 100 may be arranged such that their outermost edges approximate an ellipse shaped mark region, wherein the ellipse shaped mark region is characterized by a major axis and a minor axis, the major axis being substantially longer than the minor axis.

The pattern elements of the first structure 102 and the pattern elements of the second structure 104 may be arranged according to a set of spatial positions. For example, the pattern elements of the first structure 102 and the pattern elements of the second structure 104 may be arranged such that they form a periodic or non-periodic pattern. For instance, as shown in FIG. 1A, the two-dimensional arrangement of the pattern elements 106a, 106b, and 106c of the first structure and the pattern elements 108a and 108b of the second structure forms a uniformly spaced periodic pattern along a first direction 114.

The pattern elements of the first structure 102 and the pattern elements of the second structure 104 may be distributed along a common orientation axis 116. For example, as shown in FIG. 1B, the first structure pattern element 106a and the second pattern elements 108a and 108b may be distributed along an x-axis of orientation. It should be recognized by those skilled in the art that this axis of orientation can be chosen arbitrarily. For instance, as shown in FIG. 1C, the first structure pattern element 106a and the second pattern elements 108a and 108b may be distributed along a y-axis of orientation, where the y-axis is orthogonal to the x-axis. The labeling of each axis as the x-axis and y-axis respectively should not be interpreted as representing the orientation of the first and second structures of the described overlay marks with respect to a semiconductor layer surface. Rather, the labeling of the x-axis and the y-axis as such merely represents the orthogonality of each with respect to the other, while the set of axes may be aligned on the surface of a semiconductor layer along any chosen direction.

Figure 2C:
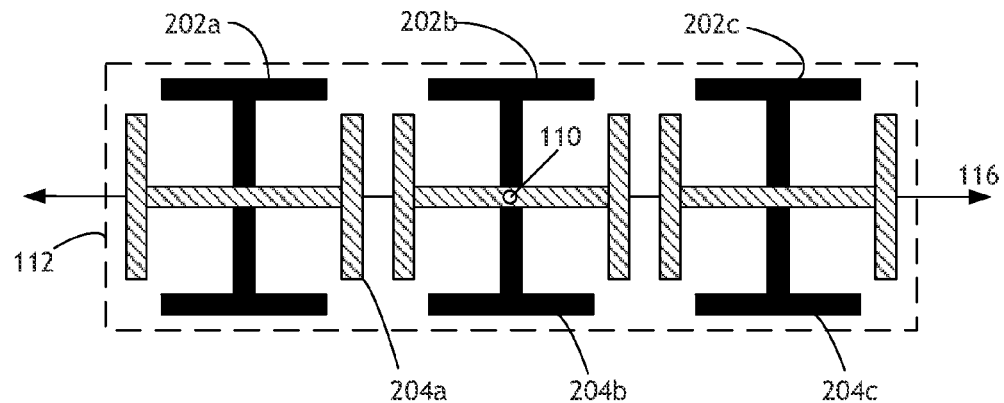
FIG. 2C is a top plan view of an overlay an overlay mark, in accordance with one embodiment of the present invention.

Referring now to FIGS. 2A through 2D, a top view of a thin overlay mark 100 suitable for imaging based metrology is illustrated, in accordance with an alternate embodiment of the present invention. The pattern elements of the first structure 102 and the pattern elements of the second structure 104 may be periodically distributed along a common orientation axis 116. For example, as shown in FIG. 2A, the pattern elements of the first structure 202a, 202b, and 202c may be periodically distributed along an orientation axis 116, such that the spatial distance between successive pattern elements of the first structure 102 is uniform throughout the first structure. Similarly, the second structure pattern elements 204a, 204b, 204c, and 204d may be periodically distributed along the orientation axis 116, such that the spatial distance between successive pattern elements of the second structure 102 is uniform throughout the second structure 104. It should be recognized that uniform distance between successive pattern elements is not a limitation, but rather an illustration, as structure elements may be periodically distributed even when there is more than one spacing distance between adjacent elements in a given structure pattern (e.g., alternating distances of d1 and d2 throughout a given structure).

In another aspect, the pattern elements of the first structure 102 and the pattern elements of the second structure may be non-periodically distributed along an orientation axis 116. For example, as shown in FIG. 2B, the first structure pattern elements 202a, 202b, 202c, and 202d may be non-periodically distributed along an orientation axis 116, such that the spatial distance between successive pattern elements of the first structure is non-uniform throughout the first structure. Similarly, the second structure pattern elements 204a, 204b, 204c, and 204d may be non-periodically distributed along the orientation axis 116, such that the spatial distance between successive pattern elements of the second structure is non-uniform throughout the second structure.

Moreover, as illustrated in FIGS. 2A and 2B, the pattern elements of the first structure 102 may be offset with respect to the pattern elements of the second structure 104. For example, as shown in FIG. 2A, the pattern elements 202a, 202b, and 202c of the first structure 102 may be spatially displaced with respect to the pattern elements 204a, 204b, 204c, and 204d of the second structure 104.

Alternatively, as shown in FIG. 2C, one or more of the pattern elements of the first structure 102 may overlap one or more of the pattern elements of the second structure 104. For example, the pattern elements 202a, 202b, and 202c of the first structure 102 may overlap the pattern elements 204a, 204b, and 204c of the second structure 104 respectively. It should be recognized that FIG. 2C does not constitute a limitation but rather only an illustration.

FIG. 2C illustrates an embodiment wherein the center of symmetry of each pattern element of the first structure 102 is coextensive with the center of symmetry of a pattern element of the second structure 104. It is contemplated, however, that one or more of the pattern elements of the first structure 102 may overlap with one or more of the pattern elements of the second structure 104, even in embodiments in which the center of symmetries of the individual pattern elements of the first structure 102 and the center of symmetries of the individual pattern elements of the second structure 104 do not coincide.

Figure 2D:
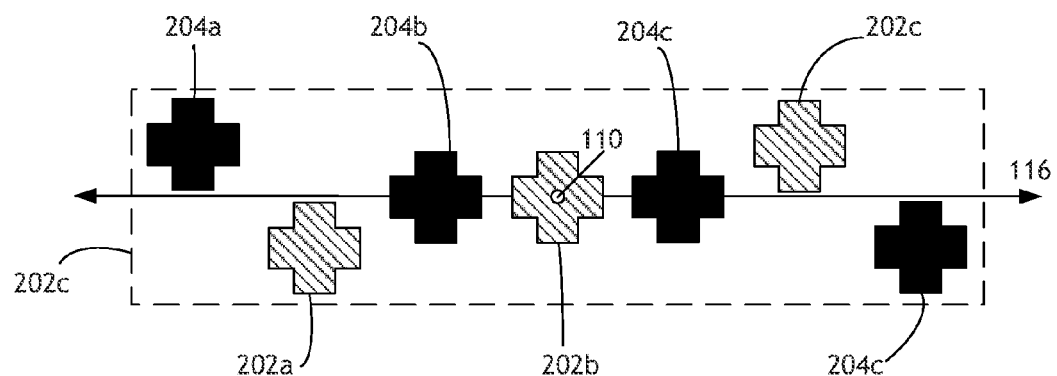
FIG. 2D is a top plan view of an overlay an overlay mark, in accordance with one embodiment of the present invention.

In another aspect, as illustrated in FIG. 2D, the pattern elements of the first structure 102 and the pattern elements of the second structure 104 may be staggered along the orientation axis 116. It should be recognized that the distribution of pattern elements 'along' the orientation axis should not be interpreted as requiring the pattern elements to reside 'on' a common orientation axis, as neither the first structure 102 or the second structure 104 are required to possess axial symmetry. Rather, the orientation axis 116 should be recognized merely as a tool for defining the geometrical arrangement of the pattern elements of the first structure 102 and the second structure 104. For example, referring to FIG. 2D, the pattern elements of the first structure 102 and the pattern elements of the second structure 104 may be distributed along the orientation axis 116 such that their individual center of symmetries are displaced with respect to the orientation axis 116. For instance, the first structure pattern elements 204a and 204d are shifted with respect to the orientation axis 116. In this case, pattern element 204a is shifted by some distance in a direction perpendicular to the orientation axis, while the pattern element 204d is shifted by an equal distance but in a direction opposite to the 204a shift direction, thus maintaining 180 degree rotational symmetry about the first structure center of symmetry 110 and creating a staggered pattern along the orientation axis 116. Similarly, the second structure pattern elements 202a and 202c may also be shifted with respect to the orientation axis 116. In this case, pattern element 202a is shifted by some distance in a direction perpendicular to the orientation axis, while the pattern element 202c is shifted by an equal distance but in a direction opposite to the 202a shift direction, thus maintaining 180 degree rotational symmetry about the first structure center of symmetry 110 and creating a staggered pattern along the orientation axis 116. It should be recognized that there is no generalized limitation on the displacement of pattern elements from a given orientation axis, provided the various pattern elements are arranged in a manner to maintain 180 degree rotational invariance about the center of symmetry of the given structure and the areal extent of the mark region that bounds the first and second structures remains 'thin,' as disclosed above.

Figure 3A:
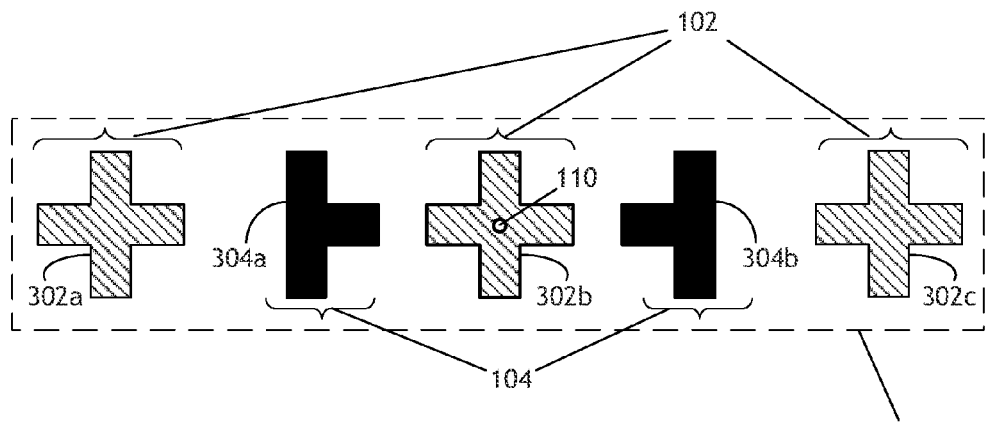
FIG. 3A is a top plan view of an overlay an overlay mark, in accordance with one embodiment of the present invention.
Figure 3B:
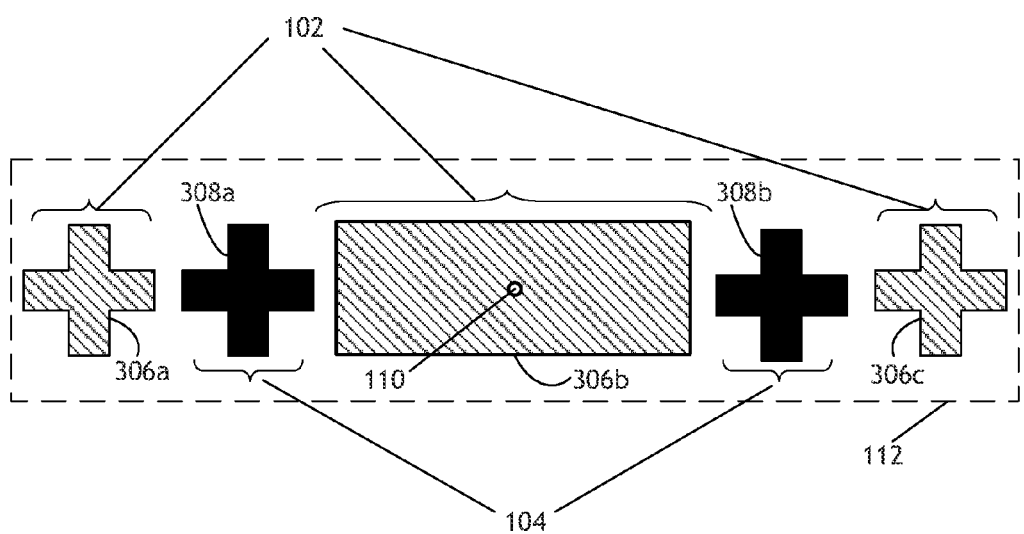
FIG. 3B is a top plan view of an overlay an overlay mark, in accordance with one embodiment of the present invention.

Referring now to FIGS. 3A and 3B, a top view of a thin overlay mark 100 suitable for imaging based metrology is illustrated, in accordance with an alternate embodiment of the present invention. Generally, the two dimensional shapes of the various pattern elements of the first structure 102 and the second structure 104 are not limited. The most often implemented pattern element shapes include geometric shapes (e.g., squares, rectangles or ellipses) or composite shapes comprised of one or more geometric shapes (e.g., crosses, T-shapes, or H-shapes).

In one aspect, as illustrated in FIG. 1A, the pattern elements of the first structure 102 may be identical to the pattern elements of the second structure 104. For example, the pattern elements 106a, 106b, and 106c of the first structure 104 are all pattern elements having a 'cross' shape, while the pattern elements 108a and 108b of the second structure are pattern elements also having an identical 'cross' shape.

In another aspect, as illustrated in FIG. 3A, the pattern elements of the first structure 102 may be different from the pattern elements of the second structure 104. For example, the pattern elements 302a, 302b, and 302c of the first structure 104 are all pattern elements having a 'cross' shape, while the pattern elements 304a and 304b of the second structure are pattern elements having a 'T-shape.'

In another aspect, as illustrated in FIG. 3B, the shapes of the pattern elements within a given structure (i.e., the first structure or the second structure) may be uniform. More specifically, the pattern elements within a given structure may be identical. For example, the second structure 104 may include pattern elements 308a and 308b both having a 'cross' shape.

In another aspect, as illustrated in FIG. 3B, the shapes of the pattern elements within a given structure (i.e., the first structure or the second structure) may be non-uniform. More specifically, a given structure may contain more than one pattern element shape. For example, the first structure 102 may include pattern elements 306a and 306c having a 'cross' shape and a pattern element 306b having a rectangular shape. It should be recognized that there is no generalized limitation on the shape of the pattern elements of the first structure 102 and the second structure 104, provided the shapes of the pattern elements and the orientation of the pattern elements results in the first structure 102 and the second structure 104 having 180 degree rotational invariance about their center of symmetry and the areal extent of the mark region that bounds the first and second structures remains 'thin,' as disclosed above.

Figure 4C:
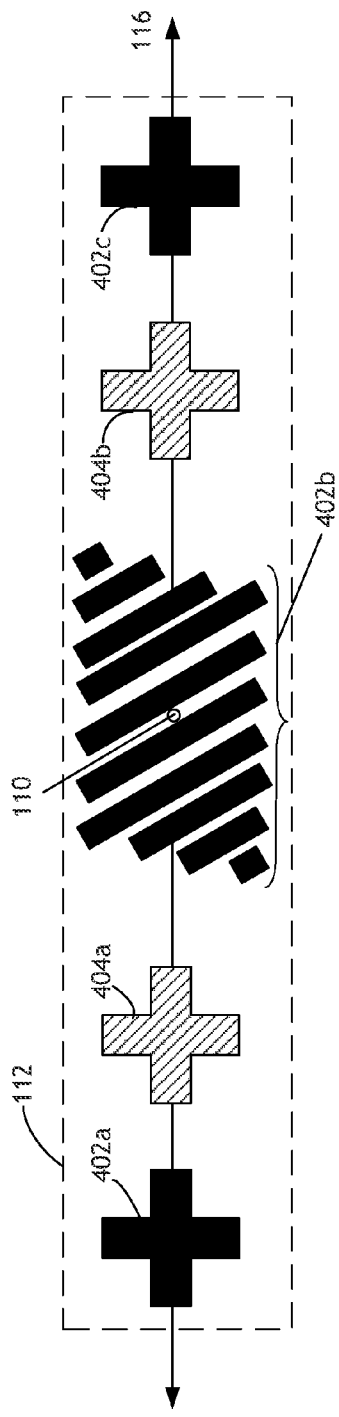
FIG. 4C is a top plan view of an overlay an overlay mark, in accordance with one embodiment of the present invention.

Referring now to FIGS. 4A through 4D, a top view of a thin overlay mark 100 suitable for imaging based metrology is illustrated, in accordance with an alternate embodiment of the present invention. The first structure 102 and/or the second structure 104 may include one or more pattern elements having two or more sub-elements. For example, as illustrated in FIG. 4A, the pattern element 402b of the first structure 102 may include six parallel aligned rectangular sub-elements.

Figure 4D:
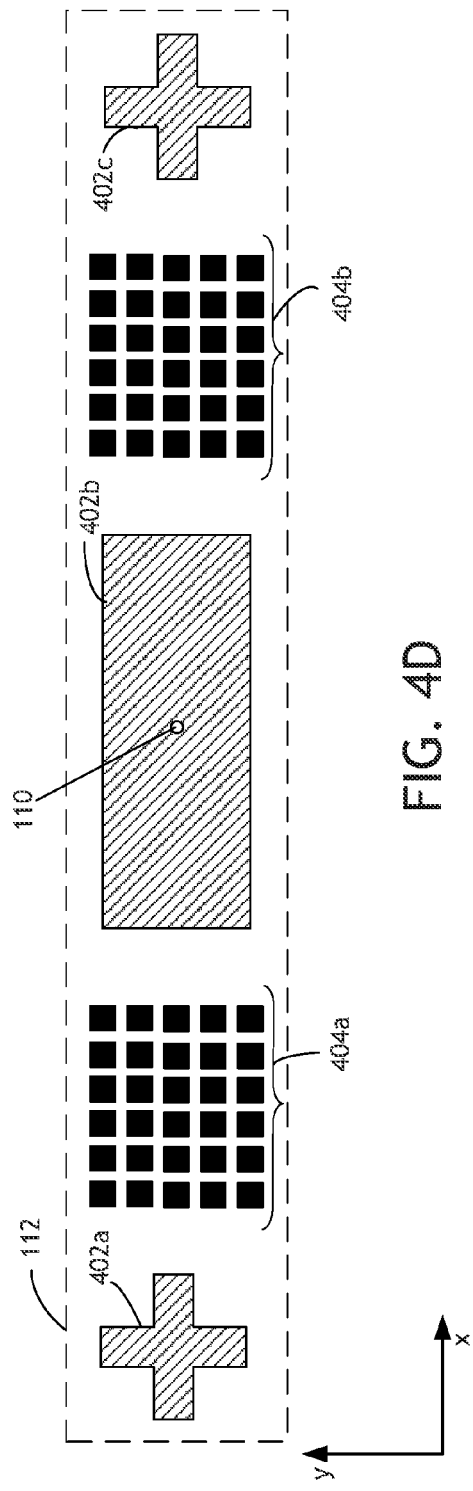
FIG. 4D is a top plan view of an overlay an overlay mark, in accordance with one embodiment of the present invention.

The two or more sub-elements of a given pattern element may be distributed according to a set of spatial positions. For example, the spatial positions of the two or more sub-elements of a pattern element may define a periodic or non-periodic pattern. For instance, as shown in FIG. 4A, the two-dimensional arrangement of the sub-elements of pattern element 402b forms a periodically spaced set of six vertically aligned rectangles, wherein the rectangular shaped sub-elements are periodically spaced along an x-axis. In another instance, the two-dimensional arrangement of the sub-elements of pattern element 402b forms a periodically spaced set of six horizontally aligned rectangles, wherein the rectangular shaped sub-elements are periodically spaced along a y-axis. More generally, as illustrated in FIG. 4C, the two-dimensional arrangement of the sub-elements of the pattern element 402b may form a periodically spaced set of six aligned rectangles, wherein the rectangular shaped sub-elements are periodically spaced along a selected direction oriented at an angle with respect to an orientation axis 116 of the first structure 102 and second structure 104. By way of further example, as illustrated in FIG. 4D, both pattern elements 404a and 404b of the second structure 104 may include an array of sub-elements. For instance, as illustrated, both pattern elements 404a and 404b include a 5×6 array of equally spaced and equally sized square sub-elements. It should be recognized that there is no generalized limitation on the number or shape of the sub-elements or the pattern formed by the arrangement of the sub-elements, provided the various pattern elements and the included sub-elements used to form the first structure 102 and second structure 104 are arranged in a manner to achieve 180 degree rotational invariance about the center of symmetry of the first structure 102 and the second structure 104 and the areal extent of the mark region that bounds the first structure 102 and the second structure 104 remains 'thin,' as disclosed above.

Figure 5A:
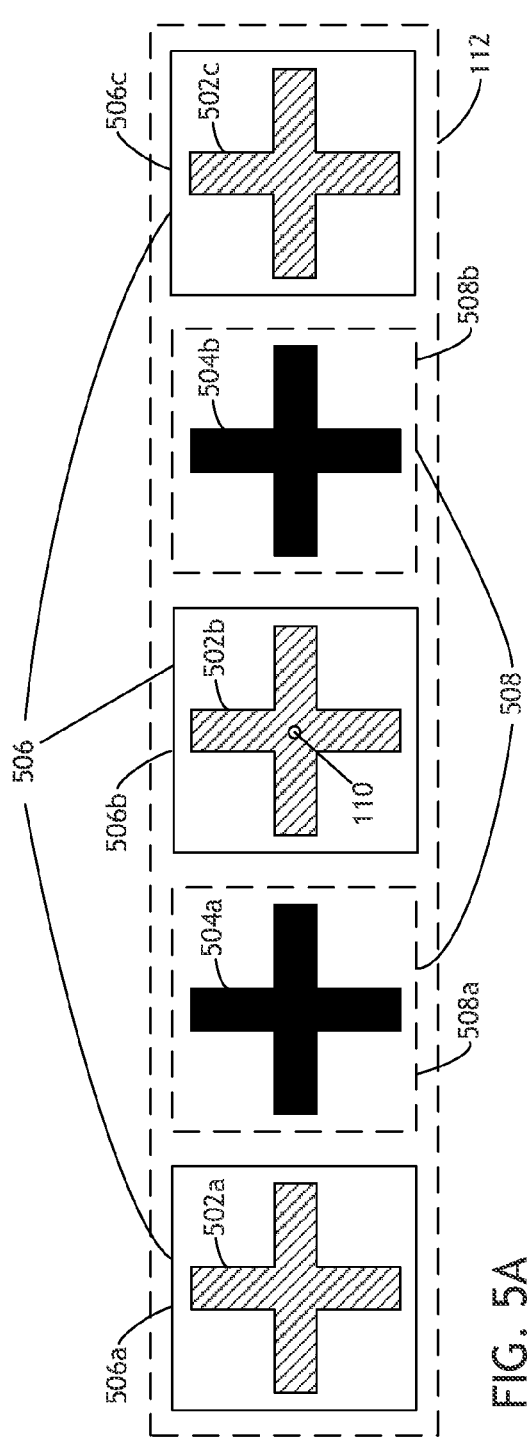
FIG. 5A is a top plan view of an overlay an overlay mark, in accordance with one embodiment of the present invention.
Figure 5B:
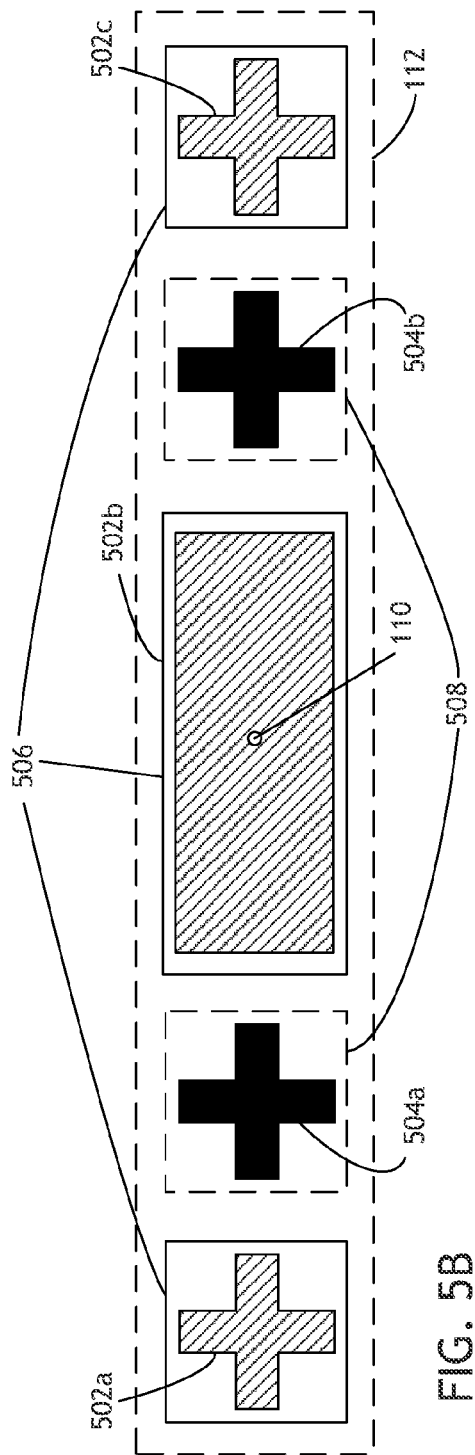
FIG. 5B is a top plan view of an overlay an overlay mark, in accordance with one embodiment of the present invention.

Referring now to FIGS. 5A and 5B, a top view of a thin overlay mark 100 suitable for imaging based metrology is illustrated, in accordance with an alternate embodiment of the present invention. The first structure 102 may be enclosed by a first region of interest (ROI) 506 consisting of one or more rectangular regions and the second structure 104 may be enclosed by a second region of interest 508 consisting of one or more rectangular regions. It should be noted that a single ROI may consist of multiple distinct non-contiguous rectangular regions. For example, as illustrated in FIG. 5A and FIG. 5B, the first structure 102, consisting of pattern elements 502a, 502b, and 502c, may be enclosed by a first ROI 506, consisting of a first rectangle 506a, a second rectangle 506b, and a third rectangle 506c. The second structure 104, consisting of pattern elements 504a and 504b, may be enclosed by a second ROI 508, consisting of a first rectangle 508a and a second rectangle 508b.

It is further contemplated that the ROIs of the thin overlay mark 100 described herein may be used to measure overlay error between two or more features formed in successive processes. The overlay error between a set of features can be defined as the difference between the positions of the center of symmetries of a first ROI and a second ROI. For example, as shown in FIGS. 5A and 5B, by design, with no overlay error, the center of symmetry of the first ROI 506 and the second ROI 508 may coincide in location with the center of symmetry 110 of the first structure 102 and the second structure 102. However, in the presence of mis-registration the relative positions of the first structure 102 and the second structure 104 shift, and as a result the relative positions of the center of symmetries of the first ROI 506 and the second ROI 508 will also shift. By measuring the difference between the center of symmetries of the first ROI 506 and the second ROI 508 the overlay error between the successively printed features can be measured. A method employing the ROI concept that may be used in the context of the presently described thin overlay mark 100 is described in U.S. application Ser. No. 12/062,874 filed on Apr. 4, 2008, and is incorporated herein by reference.

Figure 6:
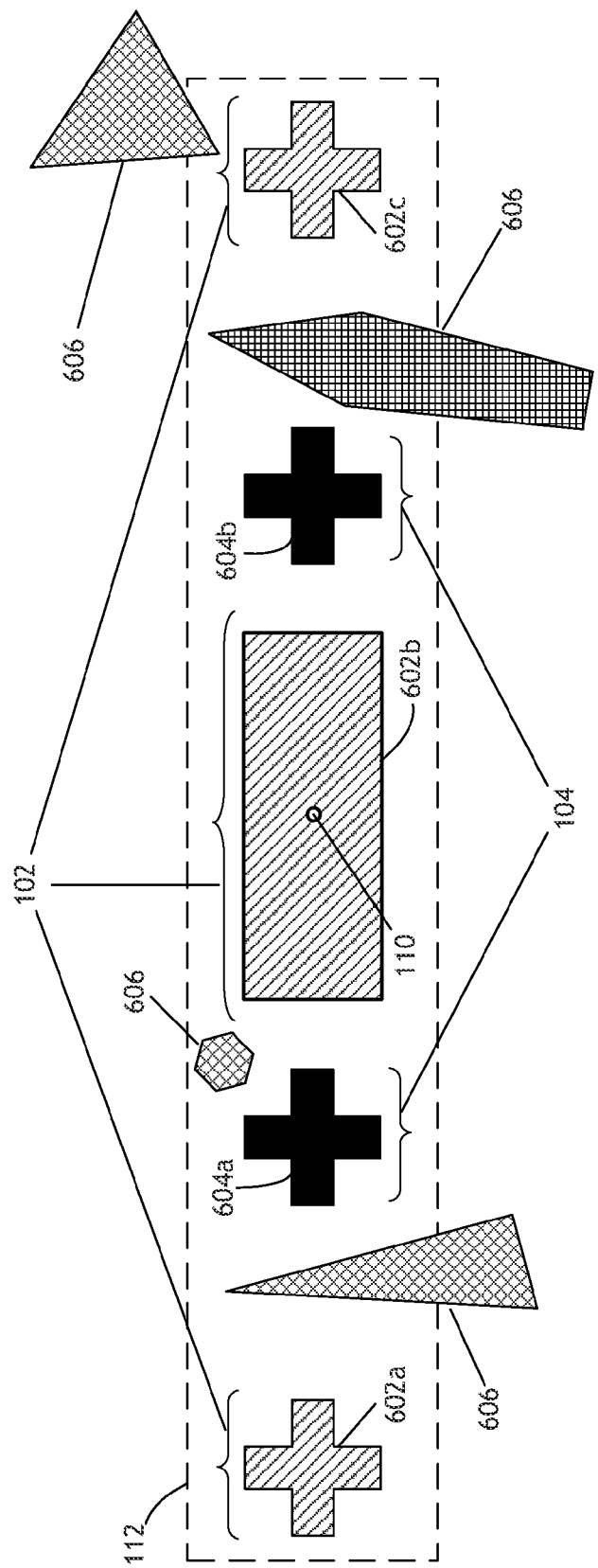
FIG. 6 is a top plan view of an overlay an overlay mark, in accordance with one embodiment of the present invention.

Referring now to FIG. 6, a top view of a thin overlay mark 100 suitable for imaging based metrology is illustrated, in accordance with an alternate embodiment of the present invention. The pattern elements of the first structure 102 and the second structure 104 of the overlay mark 100 may be arranged and distributed such that one or more device structures 606 are interspersed within the mark region 112 of the overlay mark 100. The represented device structures 606 are not components of the overlay mark 100 and are illustrated to indicate the context in which the overlay mark 100 and the first structure 102 and the second structure 104 of the overlay mark 100 may be implemented. Further, the device structures 606 may be printed at the same layers as the first structure 102 or second structure 104 or entirely different semiconductor layers. Provided the non-mark device features are displaced sufficiently from a given thin overlay mark 100 so as not to produce interference in the overlay measurement, the existence of device features in the FOV does not inhibit the implementation of an adequate overlay measurement.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A multidirectional overlay mark, comprising:
   a first structure having a first pattern element; and
   a second structure having a second pattern element,
   wherein the first structure and the second structure have a common center of symmetry,
   wherein the first structure and the second structure are invariant to a 180 degree rotation about the common center of symmetry,
   wherein the first structure and the second structure are arranged within a mark region,
   wherein the mark region is characterized by a first direction and a second direction, the second direction orthogonal to the first direction, a length of the mark region along the first direction being substantially greater than a length of the mark region along the second direction.

2. The multidirectional overlay mark of claim 1, wherein the first structure further comprises:
   at least one additional pattern element positioned on the orientation axis.

3. The multidirectional overlay mark of claim 1, wherein the second structure further comprises:
   at least one additional pattern element positioned on the orientation axis.

4. The multidirectional overlay mark of claim 1, wherein the first structure and the second structure are disposed on a common substrate layer.

5. The multidirectional overlay mark of claim 1, wherein the first structure is disposed on a first substrate layer and the second structure is disposed on a second substrate layer, the second substrate layer subsequent to the first substrate layer.

6. The multidirectional overlay mark of claim 1, wherein the first pattern element of the first structure or the second pattern element of the second structure are arranged according to a set of positions.

7. The multidirectional overlay mark of claim 6, wherein the set of positions defines a periodic pattern.

8. The multidirectional overlay mark of claim 6, wherein the set of positions defines a non-periodic pattern.

9. The multidirectional overlay mark of claim 1, wherein the first pattern element or the second pattern element comprises:
   a pattern element having two or more sub-elements.

10. The multidirectional overlay mark of claim 9, wherein the two or more sub-elements of the pattern element are distributed according to a set of positions.

11. The multidirectional overlay mark of claim 10, wherein the set of positions defines a periodic pattern.

12. The multidirectional overlay mark of claim 10, wherein the set of positions defines a non-periodic pattern.

13. The multidirectional overlay mark of claim 1, wherein the first pattern element of the first structure or the second pattern element of the second structure comprises:
   a pattern element having a geometric shape.

14. The multidirectional overlay mark of claim 1, wherein the first pattern element of the first structure or the second pattern element of the second structure comprises:
   a pattern element having a non-geometric shape.

15. The multidirectional overlay mark of claim 1, wherein the first pattern element of the first structure has a first shape and the second pattern element of the second structure has a second shape, the second shape different from the first shape.

16. The multidirectional overlay mark of claim 1, wherein the first pattern element of the first structure has a first shape and the second pattern element of the second structure has a second shape, the second shape substantially similar to the first shape.

17. A multidirectional overlay mark, comprising:
    a first structure having a first plurality of pattern elements; and
    a second structure having a second plurality of pattern elements,
    wherein the first structure and the second structure have a common center of symmetry,
    wherein the first structure and the second structure are invariant to a 180 degree rotation about the common center of symmetry,
    wherein the first structure and the second structure are arranged within a mark region,
    wherein the mark region is characterized by a first direction and a second direction, the second direction orthogonal to the first direction, a length of the mark region along the first direction being substantially greater than a length of the mark region along the second direction.

18. The multidirectional overlay mark of claim 17, wherein the first structure and the second structure are disposed on a common substrate layer.

19. The multidirectional overlay mark of claim 17, wherein the first structure is disposed on a first substrate layer and the second structure is disposed on a second substrate layer, the second substrate layer subsequent to the first substrate layer.

20. The multidirectional overlay mark of claim 17, wherein the pattern elements of the first plurality of pattern elements of the first structure or the pattern elements of the second plurality of pattern elements of the second structure are distributed along an orientation axis.

21. The multidirectional overlay mark of claim 17, wherein the pattern elements of the second plurality of pattern elements of the second structure are distributed along an orientation axis.

22. The multidirectional overlay mark of claim 17, wherein the first plurality of pattern elements or the second plurality of pattern elements include at least one pattern element having a first shape and at least one additional pattern element having an additional shape, the additional shape different from the first shape.

23. The multidirectional overlay mark of claim 17, wherein the first plurality of pattern elements or the second plurality of pattern elements include at least one pattern element having a first shape and at least one additional pattern element having an additional shape, the additional shape substantially similar to the first shape.

24. The multidirectional overlay mark of claim 17, wherein the pattern elements of the first plurality of pattern elements of the first structure are offset with respect to the pattern elements of the second plurality of pattern elements of the second structure.

25. The multidirectional overlay mark of claim 17, wherein the the pattern elements of the first plurality of pattern elements of the first structure at least partially overlaps the pattern elements of the second plurality of pattern elements of the second structure.

* * * * *